John D. Helms,
Herbert L. Brown Jr.,
Inventors.

3,505,493

APPARATUS FOR SEVERING CIRCUIT PATTERNS ON AND FORMING CONDUCTIVE CONNECTIONS THROUGH A CIRCUIT BOARD

John D. Helms and Herbert L. Brown, Jr., Dallas, Tex., assignors to Texas Instruments Incorporated, Dallas, Tex., a corporation of Delaware Filed Mar. 8, 1967, Ser. No. 621,552
Int. Cl. B23k *9/00, 11/00;* H05k *3/00*
U.S. Cl. 219—78 9 Claims

ABSTRACT OF THE DISCLOSURE

Portions of a circuit pattern on one face of a printed circuit board are removed by a lancing tool to segment the pattern. Another coordinated tool pulls an end part of a conductive ribbon from a supply, drives one end of this part through a hole in the circuit board, then disconnects said part from the ribbon supply, and thereafter welds the other end of the disconnected part to a segment of the circuit pattern. This process is useful for forming through connections between layers of circuitry of a multilayer circuit board.

BACKGROUND OF THE INVENTION

Multilayer circuit boards are often manufactured by etching circuit patterns in conductive sheets on insulating substrates. The etched patterns form circuit paths which are referred to as being laid out on X and Y axes. Holes are provided through the substrates on what is called the Z axis for forming conductive connections through the substrates between their respective patterns so that when the substrates are assembled one above another they may be interconnected. Z axis interconnections between the patterns on the various substrates have been formed by first sensitizing the inside surface of the holes to accept metal plating and thereafter plating the holes with copper or other metals. This process does not always prove satisfactory connections between layers and it does not provide connections which can be readily tested except as parts of the entire circuit formed by the circuit board interconnections. When the substrate holes are formed by drilling, some of the substrate insulating material may smear onto adjacent portions of the metal pattern and prevent good electrical contact by the plated metal and the pattern on the substrate. Plated hole connections are also prone to failure, due to stresses in the completed circuit board, and they necessarily require immersion of the board in a liquid during plating.

The so-called Z axis interconnections can also be made by a built-up process for manufacturing a circuit board, whereby alternate layers of insulating and conductive materials are formed with posts on the conductive layers forming the Z axis connections. In other instances rigid pins, eyes or the like are used to form the circuit connections between layers on the circuit board. These various methods require considerable detailed time-consuming art work. Therefore a long period of time is required for the manufacture of a circuit board. The apparatus of the invention provides greatly simplified means for forming the Z axis interconnections between layers of a multilayer circuit board.

SUMMARY OF THE INVENTION

Among the several objects of the invention may be noted the provision of improved means for segmenting a conductive circuit pattern on one face of a circuit board, and for forming a conductive path from the circuit pattern on the board through a hole in the circuit board; the provision of such apparatus wherein the operations are performed mechanically and without using the usual chemical etching and plating operations; the provision of improved apparatus for chiseling a chip or slug from a printed circuit pattern on a circuit board and removing the slug from the board; the provision of apparatus for removing a portion of a printed circuit pattern, wherein blades used for cutting the pattern are cleaned with each cycle of operation; and the provision of apparatus for forming conductive paths through a hole in a circuit board using flexible electrical conductors. Other objects and features will be in part apparent and in part pointed out hereinafter.

Apparatus of the invention comprises a lancing tool used for removing a chip or slug of metal from a circuit pattern on one face of a printed circuit board. The tool comprises a cutter which is mounted for movement toward and away from the circuit pattern for cutting the circuit pattern and effecting removal of the chip or slug from the pattern. After the circuit pattern has been segmented, a ribbon is inserted into a hole in the circuit board by a ribbon-inserting tool which forces part of the ribbon into the hole. Welding electrodes are engageable with a part of the ribbon for welding the ribbon to portions of conductive patterns on the boards near the hole.

BRIEF DESCRIPTION OF THE DRAWINGS

Corresponding reference characters indicate corresponding parts throughout the several views of the drawings.

DESCRIPTION OF THE PREFERRED EMBODIMENTS

Figures 1, 4:
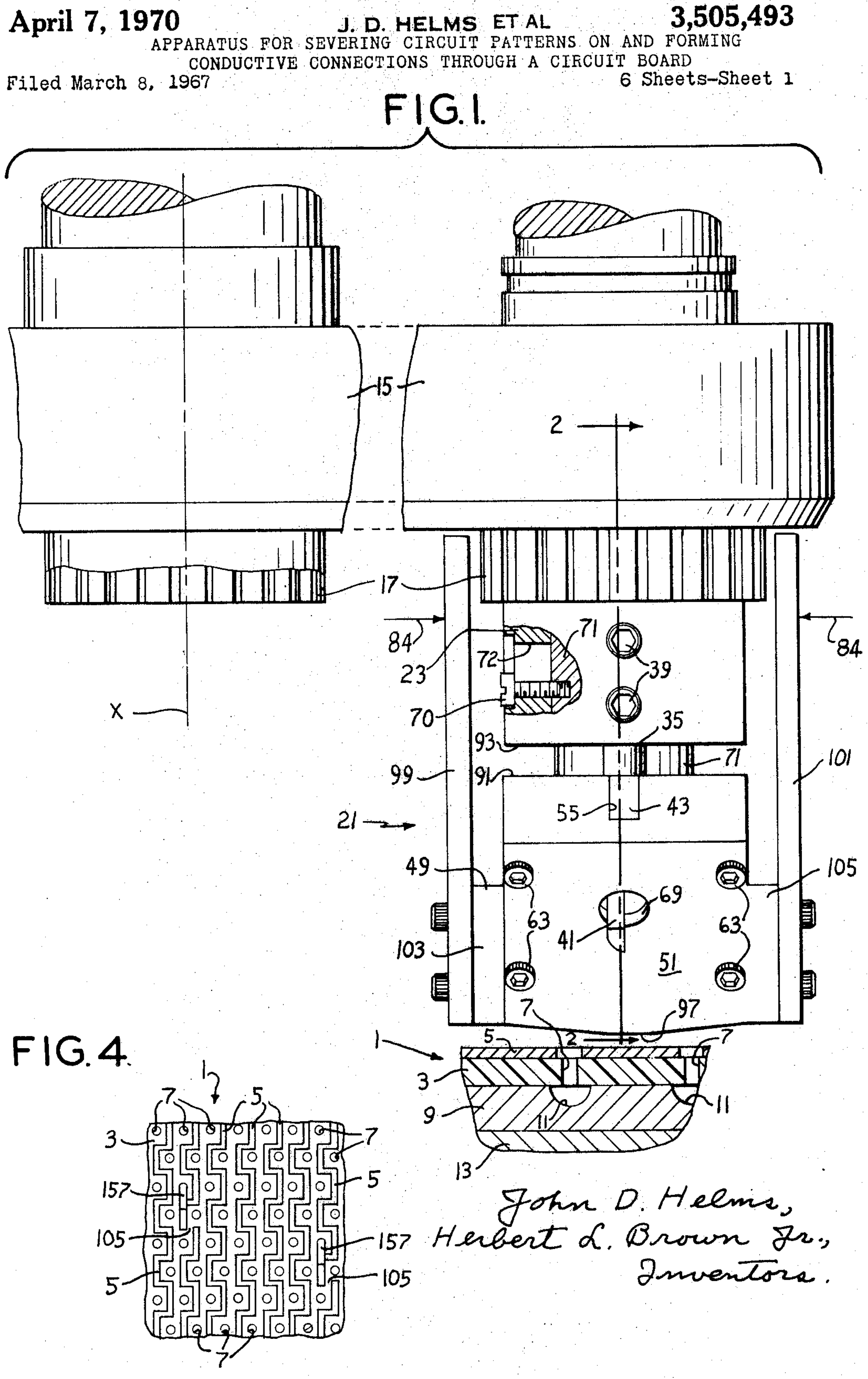
FIGURE 1 is an elevation, partially cut away, of a lancing tool positioned over a circuit board and mounted on apparatus for controlling its operation.
FIGURE 4 is a fragmentary plan of a circuit board showing portions of the circuit pattern segmented.

The apparatus of the invention is particularly useful for the manufacture of multilayer circuit boards as disclosed in the copending, coassigned United States patent application of John D. Helms for Circuit Boards, Ser. No. 594,160, filed Nov. 14, 1966. Said application discloses the manufacture of multilayer circuit boards from a plurality of individual circuit boards or substrates having standardized conductive circuit patterns on the faces of the substrates. FIGURES 1 and 4 of the drawings illustrate part of a typical standardized circuit board or substrate such as disclosed in said application. The circuit board is geenrally designated 1 in FIGURE 4 and its thickness is exaggerated for the purpose of clarity. It comprises a thin sheet 3 of electrical insulating material having a thin circuit pattern 5 on one of its faces and a plurality of holes 7 through the sheet. The pattern 5 comprises a plurality of zigzag bars or ribbons which extend in one direction of the substrate. The conductive pattern may be formed of any suitable electrically conductive material, such as copper or nickel, and may be formed on the substrate by plating and etching or the like. The arrangement and number of holes in the substrate are variable. The holes are preferably equally spaced. By way of example, holes 7 may have their centers spaced apart about 0.1 inch as measured from the top to bottom in FIGURE 4 and about 0.05 inch between centers of the holes as measured from left to right. It will be understood that the pattern of conductive material may be different on various substrates or boards making up a multilayer circuit board. Reference is made to the abovementioned Helms patent application for disclosure of other typical usable circuit patterns. The apparatus of this invention is used for severing and dividing the conductive pattern 5 into discrete segments and for forming through connections from the pattern segments through the holes 7 of the circuit board.

The circuit board 1 is placed on a plate or fixture 9 (FIGURE 1). The fixture has a plurality of openings or recesses 11 arranged so that when the circuit board layer is properly placed on the fixture each hole 7 is in register with one of the openings or recesses 11. The fixture is carried on a conventional so-called X–Y table 13 which is adapted to be moved in two directions perpendicular to each other (i.e., in an X or Y direction). Normally the table is mounted for movement in a substantially horizontal plane. The table may be part of conventional numerically controlled, punch-tape-operated apparatus comprising a rotatable circular turret 15 on which are several sleeves or adapters 17 spaced about the periphery of the turret for mounting tools or other devices for performing work. Only a portion of the circular turret is shown in FIGURE 1. The turret rotates about a vertical axis X passing through the center of the turret. The sleeves 17 and tools carried by them are moved vertically by the punch-tape-operated apparatus. The tools of the invention can be used with any suitable equipment having a table for holding the circuit board and a sleeve or other mounting means for moving the tool toward and away from the work table during a cycle of operation.

Figure 2:
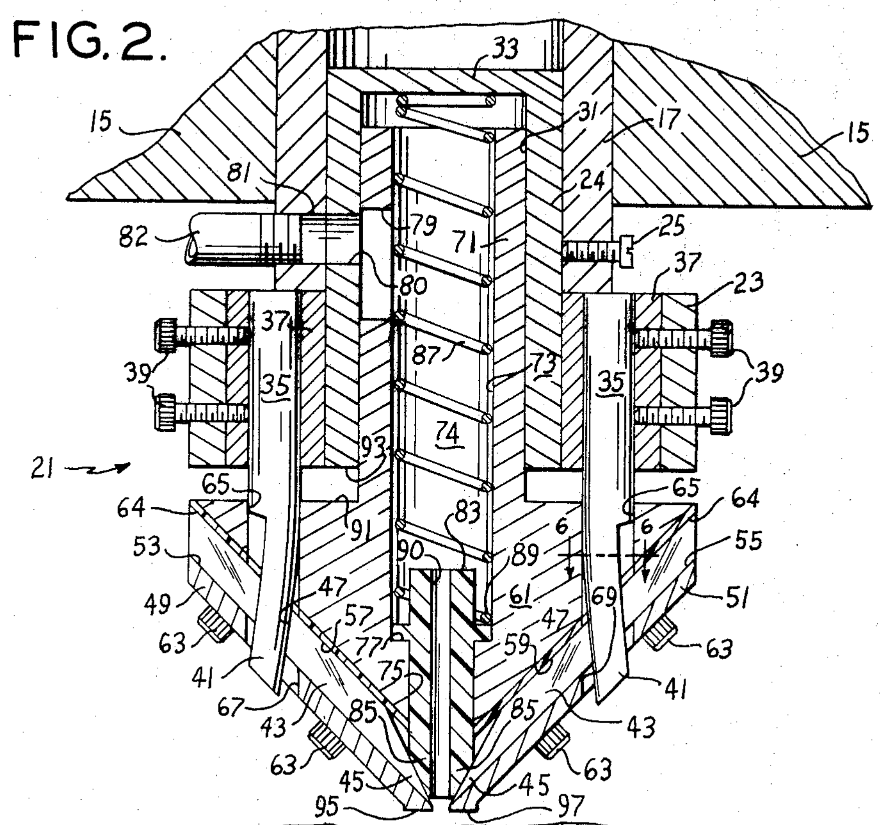
FIGURE 2 is a section taken along line 2—2 of FIGURE 1.
Figure 3:
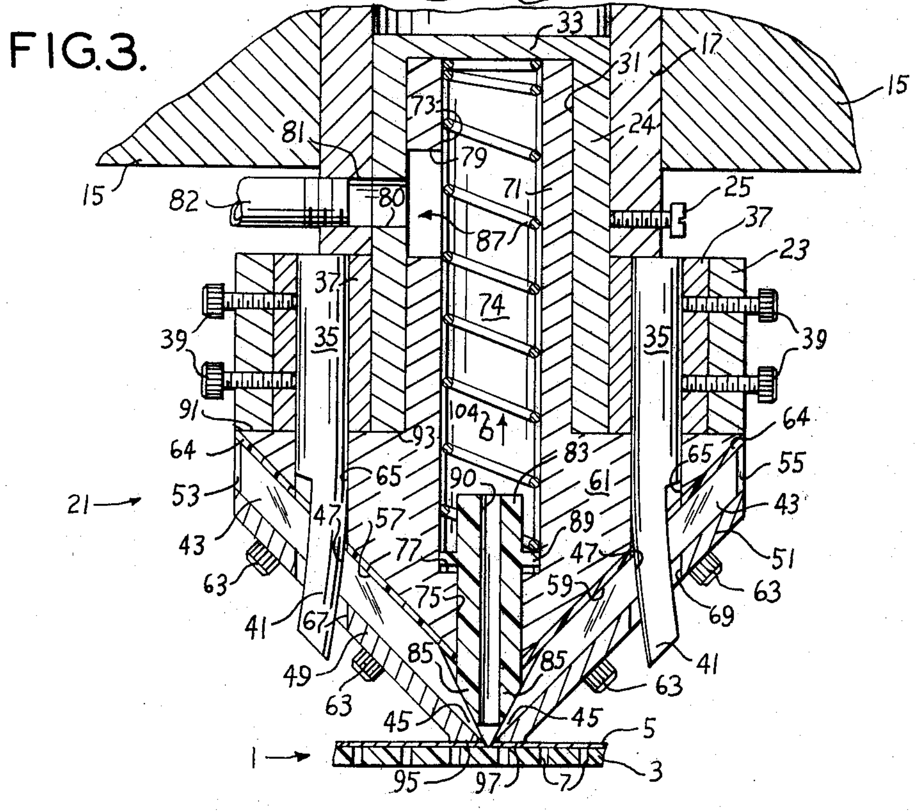
FIGURE 3 is a section similar to FIGURE 2 showing the parts in a moved position.
Figure 5:
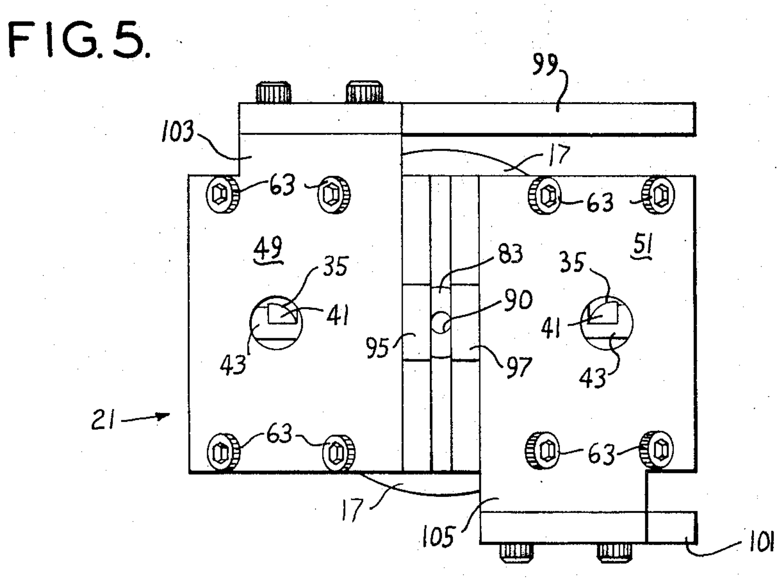
FIGURE 5 is a view of the bottom of the lancing tool.

As illustrated in FIGURES 1–3, a lancing tool 21 of this invention comprises a body 23 having a hollow stem portion 24 which fits within sleeve 17. A screw 25 in the sleeve bears against stem 24 to mount the tool in the sleeve for vertical movement with the sleeve. The stem has a cylindrical inner wall 31 and it is closed at its inner end by a wall 33.

A pair of translatory cams 35 have cylindric upper end portions received in sleeves 37 in the tool body. The cams and sleeves are fixed in the body by set screws 39. The axis of the upper portion of each cam 35 is generally vertical and the cams move vertically with the body. The cams have offset lower end portions 41 which are smaller than the upper portions thereof. Ends 41 project from the tool body and diverge from each other and away from the vertical axis of the upper part of the cams.

The tool has two elongate cutting members or lances 43. Each member 43 has an end portion which tapers to a sharp blade or knife edge designated 45. The edges 45 are normally spaced apart a slight distance and they are moved toward and away from each other as shown in FIGURES 2 and 3. The cutting members constitute lances and are used for removing a chip or slug of a printed circuit pattern 5 from the face of the circuit board during a chiseling operation described later.

Figure 6:
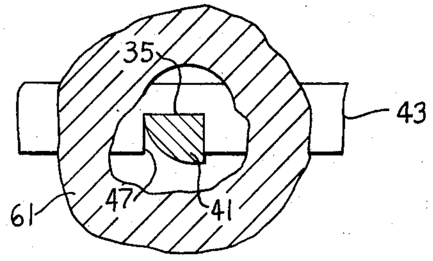
FIGURE 6 is a fragmentary section taken along line 6—6 of FIGURE 2.

The cutting members are preferably generally rectangular in transverse cross section and their longitudinal axes are substantially perpendicular to each other and at an angle of about 45° relative to the face of the circuit board. Each of the cutting members has a notch 47 (FIGURE 6) which receives the lower end 41 of the respective cam. There are close fits between the cam ends 41 and the walls of notches 47. The axis of each notch

47 is disposed at an acute angle with respect to the longitudinal axis of the cutting member 43, and the angular relation between the lances and their respective cams is such that vertical movement of the cames (i.e., perpendicular to the face of the circuit board) causes longitudinal or endwise movement of the lances toward or away from each other in substantially perpendicular planes and at angles or about 45° relative to the face of the circuit board.

A pair of plates 49 and 51 have open-end channel-shaped recesses 53 and 55, respectively, which receive the lances and guide them in their movement toward and away from each other. The plates 49, 51 are bolted to lower inclined surfaces 57 and 59 of a carrier 61 by mounting bolts 63 (FIGURES 1–3 and 5). The cutters and plates are electrically insulated from the carrier by sheets of insulation designated 64. The upper parts of the cams 35 project into holes 65 in the carrier for guiding movement of the carrier with respect to the body. The lower parts 41 of the cams project through holes 65 and through holes 67 and 69 in plates 49 and 51, respectively. The holes 65, 67 and 69 are somewhat larger than the cam ends 41.

The carrier 61 has a cylindric stem portion 71 which projects into the hole defined by wall 31 in body 23 to guide vertical movement of the carrier relative to the body 23. A set screw 70 (FIGURE 1) extends through a vertically disposed slot 72 in the body and into the stem 71 of the carrier 61, thereby to mount the carrier on the body and permit limited extension of the carrier 61 from the body 23.

The carrier 61 has a counterboard passage 74 therethrough comprising an upper portion 73 and a somewhat smaller lower portion 75. A shoulder 77 is formed by the junction between the two portions of the passage. The passage is placed in communication with a vacuum supply through lateral ports 79, 80 and 81 in the stem, body and the sleeve 17. This is accomplished over a pipe 82 to which is attached a flexible hose, not shown.

A tubular wiper member 83 in passage 74 has tapered side edges 85 at its lower end which mate with the lance blade edges 45. The wiper edges 85 are adapted to slide along the lance blades as the lances move toward and away from each other. The wiper is biased toward the blade edges 45 by a compression spring 87 which reacts from the wall 33 of the body against an annular flange 89 on the outer surface of the wiper. Downward movement of the wiper 83 is limited by engagement between flange 89 and shoulder 77, as shown in FIGURE 2. When the lances are moved toward each other the wiper is forced upwardly away from them against the biasing force of spring 87 so that it does not interfere with movement of the lances 43. When the lances 43 move away from each other from the FIGURE 3 to the FIGURE 2 position, the wiper surfaces 85 slide along lance blade edges 45 and wipe them clean of any circuit board material which they may have picked up during the lancing operation. There is a passage 90 through the wiper 83 for removing a slug of circuit pattern material as explained later.

The carrier has an upper surafce 91 which is immediately beneath a surface 93 of the body. Normally spring 87 biases carrier 61 downwardly to separate surfaces 91 and 93 as shown in FIGURE 2. Engagement between set screw 70 and the lower end of slot 72 prevents further downward movement of the carrier realtive to the body. However, the length of slot 72 permits upward movement of the carrier relative to the body until the surfaces 91 and 93 are in engagement as shown in FIGURE 3.

The center part of the lower edge of each plate 49 and 51 extends below the side edges of the plates to form a pair of contact pads or feet 95 and 97, respectively, which are adapted to contact the circuit pattern 5 on the upper face of the circuit board. Electric current is provided to the feet 95 and 97 through plates 49 and 51 from a pair of conductors 99 and 101. The conductor 99 is bolted to a flange 103 projecting from the side of the plate 49, and conductor 101 is bolted to a similar flange 105 on the side of plate 51. Electrical brushes shown by the arrows 84 on FIGURE 1 engage the conductors 99 and 101 for bringing current to the tool. The conductors 99 and 101 provide means for initially passing current between pads 95 and 97 through the segment of circuit pattern therebetween to heat and soften this segment of the circuit pattern and thus facilitate removal by the lances of a slug of the circuit pattern. After the lancing operation and while the pads 95, 97 are still in contact with the circuit pattern, a test signal is provided to pads 95, 97 to determine whether or not the lancing operation was effective in removing a slug of the circuit pattern metal. If current can still be passed between the pads, the lancing operation was not successful, but if current cannot be passed between the pads it indicates the lancing operation was successful in producing the desired electrical discontinuity.

Operation of the lancing tool is as follows:

Initially the X–Y table 13 is moved until the portion of the circuit pattern 5 beneath the tool is a portion which is to be removed to segment a bar of the printed circuit pattern and separate the segments by a gap which will electrically insulate or isolate the segments from each other. When the table stops, the sleeve 17 is moved downwardly during the first half cycle of the operation and then it returns to its FIGURE 1 position. During downward movement of the sleeve the feet or pads 95 and 97 engage the circuit pattern 5 as shown in FIGURE 3. This engagement prevents further movement of the carrier 61 but, due to the sliding fit between the carrier and the body of the tool, further downward movement of the body is permissible to the extent that surface 91 on the carrier and the surface 93 immediately above it are initially separated.

When pads 95 and 97 contact the circuit pattern it is preferred that short pulses of a large current be applied therebetween to heat and thereby soften the portion of the circuit pattern 5 between the pads, i.e., the portion of the pattern which is to be removed by operation of the tool. As sleeve 17 continues to move downwardly the cams 35 move through the carrier 61 and the notches in the cutting members 43 to effect movement of the cutting members from the FIGURE 2 position toward each other to the FIGURE 3 position. During this movement a slug or chip 104 (FIGURE 3) of the circuit pattern is chiseled from the circuit pattern by the cutting edges or blades 45 on the lances. The vacuum lifts slug 104 from the surface of the circuit board and draws it upwardly through the tool. The removal of the slug 104 leaves a gap such as at 105 (FIGURE 4) between two adjacent segments of a bar of the circuit pattern, thus providing electrical discontinuity between them. A test signal may also be applied to the pads 95, 97 to determine if the lancing operation has been successful in providing the desired electrical discontinuity between the segments of the circuit pattern.

The lances 43 reach their positions nearest each other for removal of the chip at the time the surfaces 91 and 93 come into engagement. Then the sleeve 17 begins the upward stroke of its cycle of operation. As this occurs, cams 35 are partially withdrawn from the lances, and the relative movement therebetween causes retraction of the lances from the FIGURE 3 to the FIGURE 2 position. Initially the body 23 moves upwardly while the carrier 61 remains stationary in its lowered position due to the action of the spring 87 in biasing the carrier downwardly with respect to the body of the tool. This biasing force acting against the wiper member holds it in engagement with the blade edges 45 as they are retracted, thereby wiping the blade edges clean of any circuit board material which may have adhered thereto.

Eventually the carrier 61 reaches its maximum extended position (as determined by the length of the slot 72) and then moves upwardly with the body of the tool and the sleeve 17. The X–Y table 13 is then moved to locate another portion of the circuit pattern beneath the tool and the lancing operation is repeated. After all lancing operations are complete the turret 15 is indexed to bring the tool shown in FIGURES 7–11 into its operative position.

Figures 8, 9:
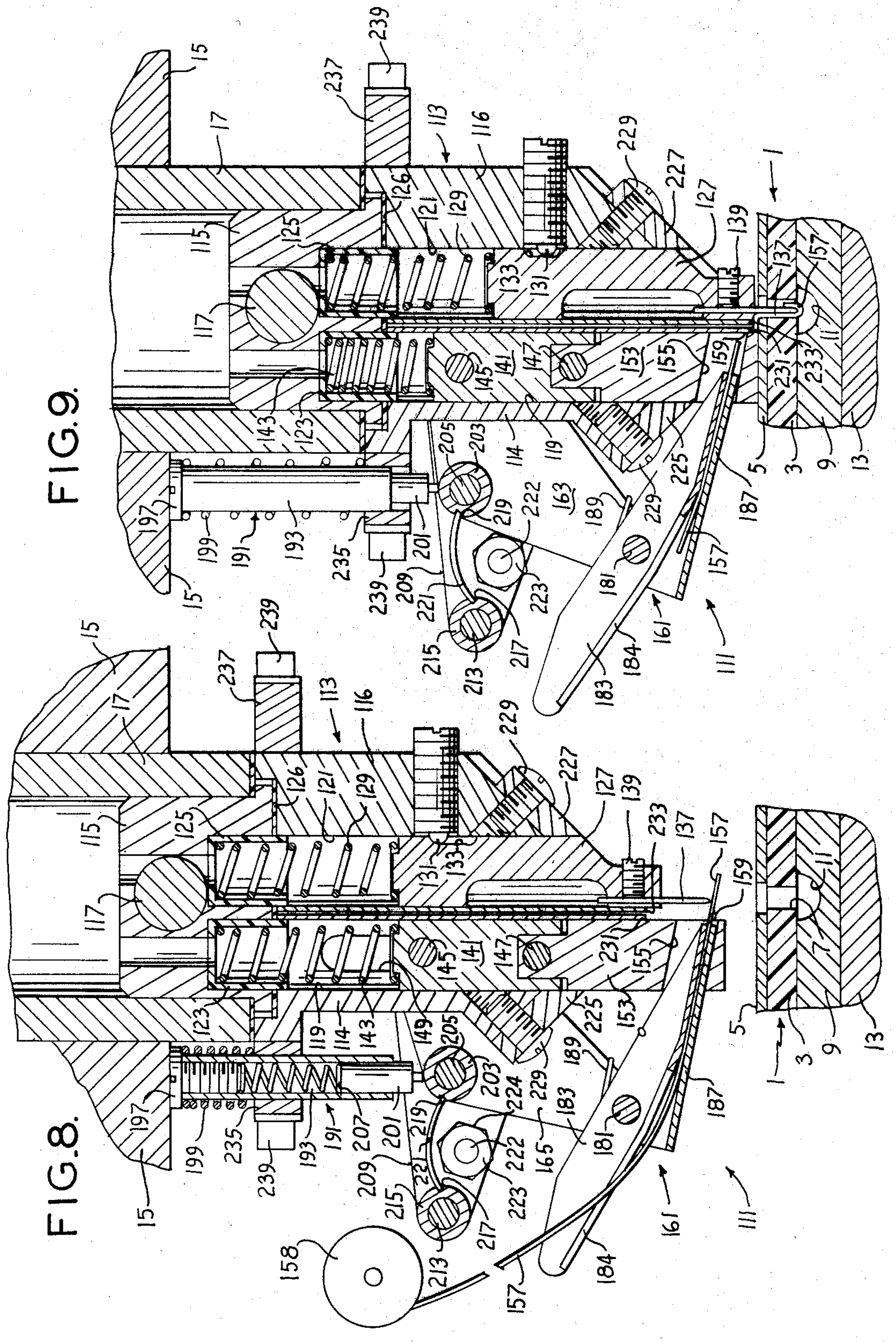
FIGURE 8 is a section taken along line 8—8 of FIGURE 7.
FIGURE 9 is a section similar to FIGURE 8 but showing the parts in a moved position.
Figures 10, 11:
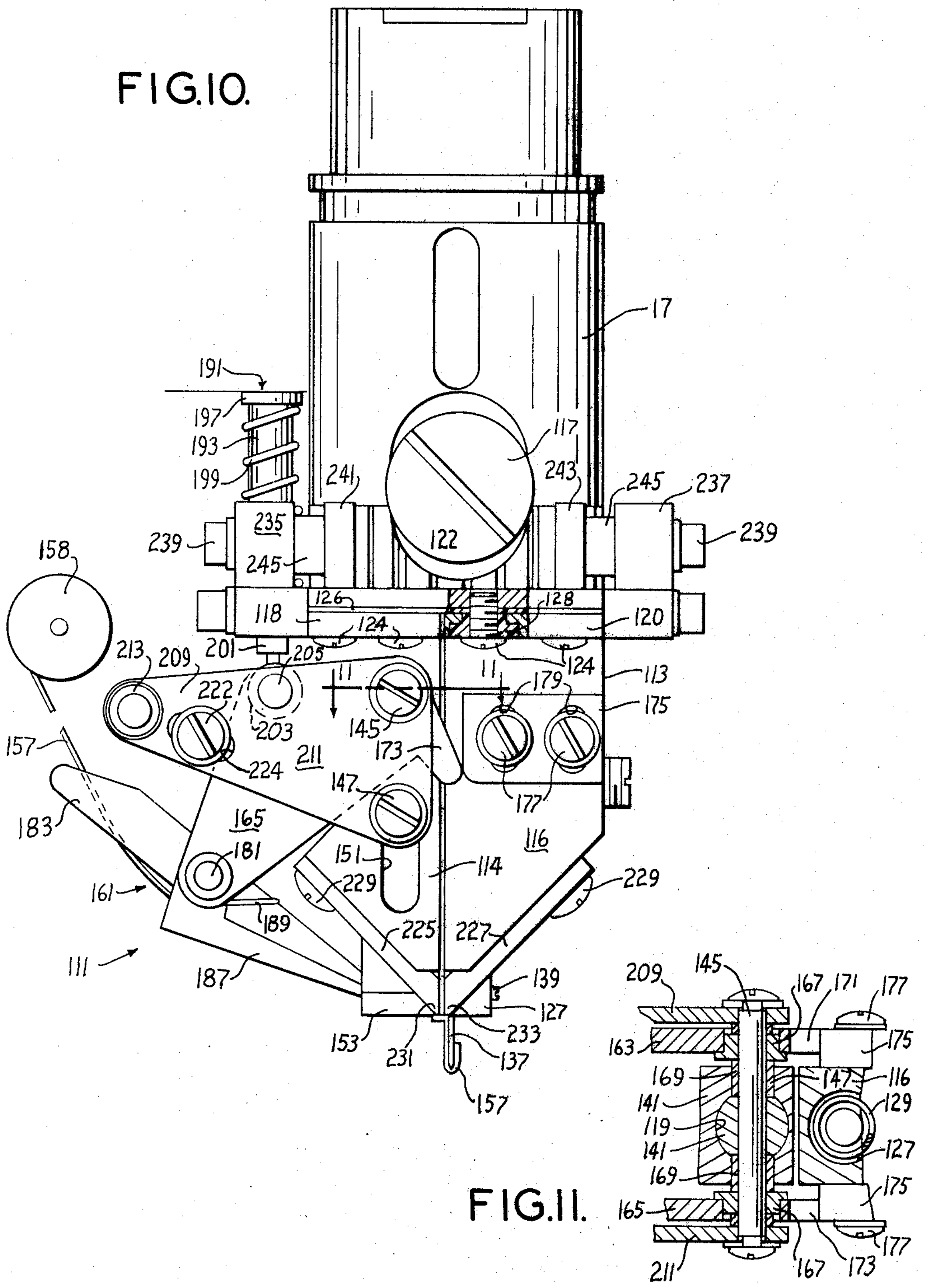
FIGURE 10 is an elevation of the inserter and welder tool with the parts in the position shown in FIGURE 9.
FIGURE 11 is a fragmentary section taken along line 11—11 of FIGURE 10.

Referring now to FIGURES 7–11, a second tool generally designated 111 is used for inserting a conductive ribbon into a hole 7 in the circuit board and for bonding the ribbon to the pattern 5 on the board. The tool 111 comprises a tool body 113 having a boss 115 which it fits into one of the sleeves 17 carried by the turret 15. Body 113 is fixed to the sleeve for movement therewith by a set screw 117 which extends through the sleeve and into boss 115. The tool body has two separate body portions 114, 116 (FIGURES 8–10). Mounting flanges 118, 120 on body portions 114 and 116, respectively, are bolted to a mounting flange 122 on the boss 115 by screws 124. Flange 122 is electrically insulated from flanges 118, 120 by a sheet 126 of insulating material and by nonconductive sleeves 128 around screws 124.

Two holes or openings 119 and 121 located side by side in body portions 114 and 116, respectively, open to the lower end of the body. The longitudinal axes of the holes are generally parallel to each other as shown in FIGURES 8 and 9. Sleeves 123 and 125 of electrical insulating material are positioned at the inner ends of the holes.

A needle holder 127 in hole 121 is adapted to move between a position shown in FIGURE 8 to a position shown in FIGURE 9. The needle holder is biased from its FIGURE 9 toward its FIGURE 8 position by a helical spring 129 which reacts from the sleeve 125 against the upper end of the needle holder. Extension of the needle holder is limited by a spring-biased detent assembly 131 which is received in a short slot or groove 133 in the needle holder for limited movement thereof. The body of the detent assembly is threaded in the body portion 116. In FIGURE 8 the holder 127 is extended relative to the body portion 116 and in FIGURE 9 it is retracted relative thereto. A ribbon inserter needle 137 is clamped to the lower end of the holder 127 by a set screw 139. The lower end of the needle is preferably rounded so that it does not puncture or sever the ribbon while being inserted into the holes in the circuit board.

A shear bar guide 141 is positioned in hole 119. It is movable between the FIGURE 8 extended position and the FIGURE 9 retracted position. The guide 141 is biased toward the FIGURE 8 position by a spring 143 in hole 119 and reacts from the sleeve 123 against the upper end of the guide. Movement of the guide is limited in both directions by engagement between a pair of pins 145 and 147 passing through the guide and the ends of a pair of vertical slots 149 and 151 which extend through the body portion 114 between hole 119 and the outer surface thereof. Thus guide 141 can move upwardly until the pin 145 engages the upper end of slots 149 and 151 and extension of the guide is limited by engagement between pin 147 and the lower end of slots 149 and 151.

A ribbon shear bar 153 at the lower end of guide 141 is connected to the guide by pin 147 passing through a stepped portion of the bar which is received into a hole in the lower end of the guide. At the lower end of the bar there is a transverse hole 155 through the bar from left to right as viewed in FIGURES 8 and 9. A portion of a ribbon 157 from a spool 158 of the ribbon is fed through the hole 155 and beneath the lower end of needle 137 as shown in FIGURE 8. Preferably the ribbon is rectangular in cross section although other shapes may be used if desired. The ribbon is fed over a sharp edge 159 at the lower right side of hole 155 and this edge constitutes half of the cutting means for shearing the ribbon 157 as explained below.

Ribbon 157 is held and advanced by means generally designated 161 which comprises a pair of triangular plates 163 and 165 which constitute links. The pivot pin 145 extends through one end portion of each of the links as shown in FIGURE 11. Bearings 167 facilitate rotation of the links 163, 165 on the pin 145. A pair of spacers 169 are positioned in the body portion 114 between flat surfaces on the bar guide 141 and the bearings to hold each of the parts in its relative position. Each of the links 163 and 165 has a projecting finger portion 171 and 173, respectively, which constitute cam followers and are engageable with cam members 175 (FIGURE 10) mounted on the body portion 116 by clamp screws 177. The screws pass through a pair of elongate slots 179 in each cam so that the cams can be adjusted in a vertical direction for clamping as viewed in FIGURE 10, thereby varying the time in the cycle of operation at which the links are swung about pivot pin 145 between the positions shown in FIGURES 8 and 9.

Figure 7:
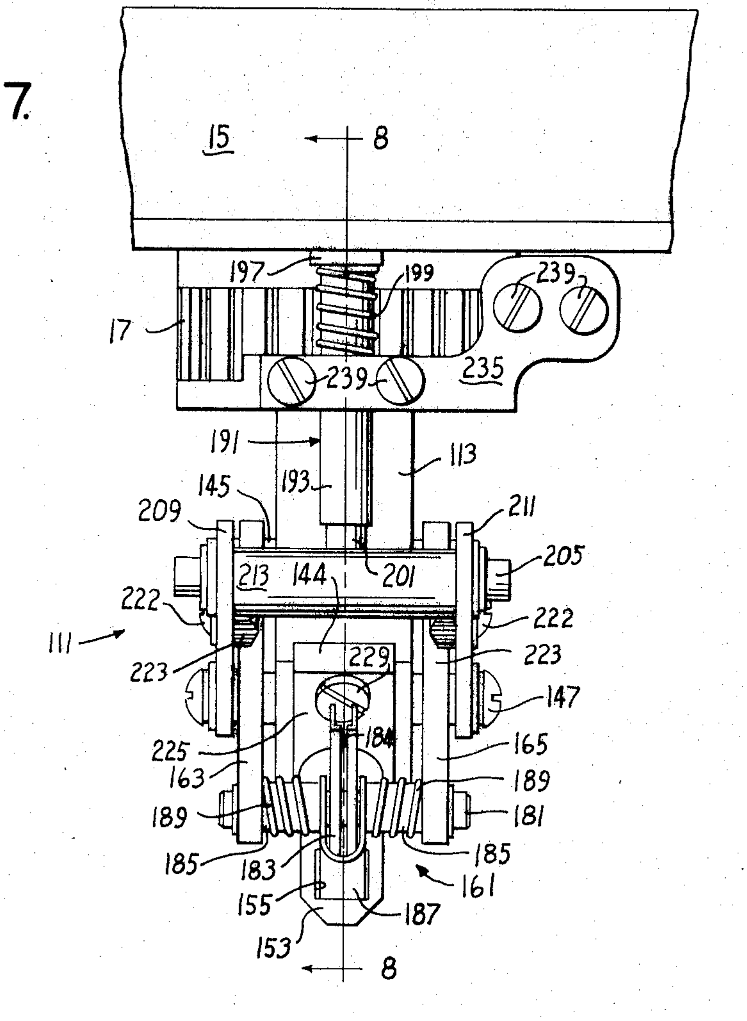
FIGURE 7 is an elevation of a ribbon inserter and welder tool of this invention.

A pin 181 is carried by the link members 163 and 165 near the ends thereof opposite the pivot pin 145. An upper clamp member 183 is pivoted on pin 181 and held centered on the shaft by a pair of spacers 185 (FIGURE 7). Member 183 is generally U-shaped and is slotted at its left end as shown at 184 to receive ribbon 157. A plate 187 constitutes a lower clamp member. The plate is substantially flat at its right end (as viewed in FIGURES 8 and 9) and it is generally U-shaped at its other end as shown in FIGURE 7. The U-shaped end of the lower clamp member straddles clamp member 184 and is pivoted on pin 181. The upper clamp member is biased toward plate 187 by a pair of torsion springs 189 which surround spacers 185 and have their ends attached to the clamp member 183 and to one of the link members 163 or 165. The clamp can be opened against the biasing force of springs 189 to feed the ribbon through the clamp by pushing downwardly on the left end of the upper clamp member (as viewed in FIGURES 8–10). When the clamp member is released, the springs 189 bias it clockwise against the ribbon 157. The small angle defined by the upper and lower clamp members permits the ribbon to be pulled between them from the left toward the right even when the clamp is being biased downwardly against the ribbon. However, reverse movement of the ribbon is prevented. Thus when the needle inserter 137 has engaged the ribbon and is pushing it downwardly into a hole in the circuit board, the movement of the ribbon-advancing means from the FIGURE 8 to the FIGURE 9 position can occur without pulling the ribbon to the left. In operation, a new portion of the ribbon is fed from spool 158 through the ribbon-holding and advancing means 161 by movement of said means 161 to the FIGURE 9 position, and this new portion of the ribbon is then moved to the right beneath the needle when the parts return to their FIGURE 8 position.

The ribbon-advancing means 161 is returned to the FIGURE 8 position by a reset device generally designated 191 comprising a sleeve 193 which has a sliding connection with a bush or conductor 235 carried by the tool body 113. The upper end of sleeve 193 is closed by a screw 197 of nylon or other nonconductive material. The head of this screw bears against the underside of turret 15 and it also projects radially beyond the surface of the sleeve. A coil spring 199 reacts from the brush against the head of screw 197 so that when the body and the brush move downwardly away from the turret to the FIGURE 9 position the sleeve remains substantially stationary with the screw head bearing against the turret.

A plunger 201 is partially received in sleeve 193 and partially projects from the lower end of the sleeve. The projecting part of the plunger bears against a spacer 203 carried by a pin 205 which extends through the link members 163 and 165 about half way between the pins 145 and 181. Plunger 201 is biased toward its extended position (FIGURE 8) by a spring 207 in sleeve 193 which reacts from the screw 197 against the plunger. Since the plunger bears against the spacer 203, the spring 207 biases the entire ribbon-advancing means 161 about pivot 145 toward the FIGURE 8 counterclockwise position. When the ribbon-advancing means moves to the FIGURE 9 position, plunger 201 is pushed into the sleeve.

A pair of triangular support plates 209 and 211 at opposite sides of body 113 are carried by the pins 145 and 147 in the sliding members 141 and 153. Therefore plates 209 and 211 may be moved vertically without rotation. A pin 213, supported by these plates, is positioned in spaced relation to the links 163 and 165 and to the pin 205. A spacer 215 is clamped between the supports 209 and 211 by the pin 213. The spacer 215 has a notch 217 which generally faces the spacer 203. The spacer 203 has a corresponding notch 219 facing the spacer 215. Spacer 203 is held in place by the pin 205. Both spacers can be adjusted about their axes by loosening and retightening their respective mounting pins. A leaf spring 221 has its ends sprung into the notches 217 and 219. It is bowed upwardly as viewed in FIGURES 8 and 9. The locations of the notches are so adjusted that when the parts are in their FIGURE 8 position the biasing force of the leaf spring is directed against the spacer 203 to bias the pin 205 downwardly. This biases the ribbon-advancing means toward its FIGURE 8 anticlockwise position. However, when the cam means 173, 175 begin swinging the links 163 and 165 clockwise about pin 145, the force exerted by the leaf spring 221 is soon directed above the axis of pin 205 and thereafter the biasing force of the leaf spring urges the ribbon-advancing means toward the FIGURE 9 clockwise position. At this time, spring 221 opposes the biasing force of spring 207.

Two bolt and nut assemblies 222, 223 are carried by supports 209, 211. These are adjustable in slots 224 in the supports. The nuts constitute stops for limiting movement of the links 163 and 165 in a clockwise direction.

Two welding electrodes 225 and 227 are secured to the body portions 114 and 116, respectively, by screws 229 (FIGURE 10). The electrodes are secured to tapered surfaces of the body portions which are disposed at substantially right angles relative to each other. Each electrode has a contact portion as shown at 231 and 233, adapted to engage the ribbon 157 for welding it to the circuit pattern 5 on the circuit board. The needle bar guide 127 and the shear bar guide 141 pass through holes in the electrodes. This permits the electrodes to move downwardly with respect to the members 127, 141, and 153 as the contact portions 231 and 233 are moved into engagement with the ribbon.

Welding current is provided to the electrodes from a pair of conductors 235 and 237 secured to body portions 114 and 116, respectively, by screws 239. The path for the welding current is from conductors 235 and 237 through the body portions 114 and 116 to electrodes 225 and 227, respectively. The insulation 126 between the body portions 114, 116 and the stem portion 115, together with the insulation shown at 123 and 125, prevent electrical short circuits between the conductors. As shown in FIGURES 8 and 9, the body portions 114 and 116 are separated from each other and insulation can be placed between them if desired. The conductors 235, 237 receive current from appropriate brushes or flexible leads (not shown) which may be supported from the turret.

A pair of feedback brushes 241 and 243 may be provided and connected to the conductors 235 and 237 by insulator blocks 245. The brushes 241 and 243 provide signals to the control apparatus for the welder. Brushes 241, 243 receive signals from the electrodes either directly by conductors (not shown) attached to the brushes and the electrodes or by using conductive screws 239 to provide a conductive path between brushes 241, 243 and the conductors 235, 237.

Operation of the tool 111 of FIGURES 7–11 is as follows:

Assume initially that the ribbon 157 has been fed through the advancing means 161 and an end portion of the ribbon positioned immediately beneath the needle 137 as shown in FIGURE 8. Operation of the X–Y table moves the circuit pattern beneath the tool until needle 137 is immediately over a hole near a segment of the circuit pattern 5 which is to be connected through the hole to another layer of the circuit board, to a terminal strip or the like. When the table stops, sleeve 17 is caused to move toward the table, thereby moving body 113 toward the circuit board. As this occurs, the lower surface of the ribbon shear bar 153 first contacts the upper face of the circuit board and it then remains stationary while the remainder of the tool continues to move down. At this time spring 143 compresses. Immediately after the shear bar 153 stops, the needle 137 engages the projecting end of ribbon 157, causing the ribbon to wrap around the end of the needle. Then the needle with the ribbon wrapped around it enters a hole 7 in the circuit board (FIGURE 9). Downward movement of the needle continues until it bottoms out in the corresponding or mating recess 11 in plate 9. Then the needle 137 and the guide 127 mounting it remain stationary.

As the body moves further down subsequent to the time the bar 153 stops, the cam followers 171, 173 on the ribbon-advancing means are engaged by the cams 175 on body portion 116 to swing the ribbon-advancing means 161 clockwise in retraction about the axis of the pin 145, i.e., from the FIGURE 8 position wherein it holds the ribbon in position to be engaged by the needle bar, to the FIGURE 9 position wherein it is substantially withdrawn from the ribbon shear bar 153. As this clockwise movement of means 161 occurs, the ribbon 157 is simultaneously pulled by the needle 137 through the means 161 between the clamp member 183 and the plate 187.

The tool continues its downward movement until the contact portions 231 and 233 of the electrodes engage the ribbon 157. As electrode 225 moves past the cutting edge 159 on the shear bar 153, the ribbon is cut, leaving a small end portion of the ribon projecting from the end of the retracted clamp 183. The projecting end portion of the ribbon is subsequently fed beneath the needle 137. The ribbon-feeding means 161 continues to move clockwise as viewed in FIGURES 8 and 9 due to the engagement between the cam follower and the cams and also due to the biasing force of spring 221 which tends finally to snap the ribbon-feeding means toward the FIGURE 9 position when the force exerted by spring 221 is directly above the center of pin 205, thereby moving the outermost end of the ribbon away from the electrode 231. This is desirable since it overcomes the frictional engagement between the ribbon and the electrode when the electrode is later raised. This engagement could otherwise raise the ribbon so that it would not be properly fed beneath the inserter 137. The action of spring 221 also tends to hold the ribbon inserter in the FIGURE 9 position (against the force of the reset mechanism 191) until the body portion 114 moves upwardly far enough to change the direction of the force exerted by spring 221 on the ribbon feed mechanism, that is, until the ribbon feed mechanism is biased by spring 221 toward the FIGURE 8 position. This prevents feeding of the projecting end of the ribbon into the electrode 231 or inserter 137 until they have been raised out of the path of travel of the ribbon.

When the electrodes have contacted the ribbon (FIGURE 9), a welding voltage is applied across the electrodes from the conductors 235 and 237 for welding the ribbon to the circuit board pattern 5. The welding operation can be controlled by using a feedback signal picked up by members 241, 243 for determining when a weld of the desired quality has been formed. Also, the needle electrode 137 and the plate 9 can be used as electrodes for another welding cycle by means of which the ribbon 157 in the hole can be welded to another ribbon in the hole at the lower side of the circuit board. The second ribbon may be a ribbon fed into the plate hole from another lower circuit board or substrate in a multilayer circuit board such as disclosed in the before mentioned patent application by John D. Helms.

After the welding cycle is complete, adapter 17 moves upwardly, carrying with it the tool 111. Initially the welding electrodes and body portions 114 and 116 are moved upwardly with respect to both the needle 137 and the shear bar 153. However, when the springs 129 and 143 have biased the needle 137 and shear bar 153 to their FIGURE 8 returned positions, further upward movement of the adapter is accompanied by the entire tool moving as a whole. During this upward stroke of the cycle of operation the ribbon-advancing means 161 returns to the FIGURE 8 position under the biasing force of spring 207 acting through plunger 201 and the force of spring 221. As this occurs the end portion of ribbon 157 projecting from the right edge of clamp 183 is moved beneath the needle 137 where it is properly positioned for a subsequent cycle of operation of the apparatus. As above noted, spring 221 initially opposes movement of the ribbon-feeding mechanism to its FIGURE 8 position, thus preventing engagement between the end of the ribbon and the electrode 231.

The cycle of operation is repeated until all through connections are complete. Then another circuit board layer can be positioned over the board layer 1, the lancing operation and the programmed ribbon-inserting and -welding operations performed, etc., until the desired number of layers are provided. The layers may be secured together in the manner described in the before mentioned Helms patent application.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. Apparatus for segmenting a conductive circuit pattern on a face of a printed circuit board and for forming conductive paths from the pattern through holes in the board adjacent the circuit pattern, the apparatus comprising:

a lancing tool having a pair of cutting members, each of said cutting members having a blade formed at one end thereof, mounting means for movably securing the cutting members to the lancing tool, said mounting means adapted for movement of the blades relative to the circuit pattern, coordinating means adapted for engagement with the cutting members to effect joint movement of the blades of the cutting members with respect to the circuit pattern for cutting the circuit pattern to effect removal of part of the pattern and thereby segment the pattern, a ribbon inserting tool having a ribbon inserter mounted on a frame attached to the apparatus, the frame being adapted for vertical movement, means attached to the frame for advancing a first portion of a ribbon into a position between the ribbon inserter and a hole in the circuit board, means connected to the ribbon inserter for moving the ribbon inserter into and out of the hole, the ribbon inserter having a portion engageable with the ribbon for forcing the first portion of a ribbon into the hole as the ribbon inserter is forced into the hole, and a welding device mounted on the frame, the welding device having electrodes attached thereto, the electrodes further being adapted to engage a second portion of the ribbon and place it on a portion of the conductive pattern on the circuit board near the hole to weld the ribbon to the conductive pattern.

2. Apparatus according to claim 1 wherein the lancing tool further comprises means connected to the lancing tool fr picking up the part of the circuit pattern cut from the face of the circuit board by the cutting member.

3. Apparatus according to claim 1 wherein the lancing tool further comprises wiper means carried by the tool and engageable with the blades of the cutting members for cleaning the blades after each cutting operation of the tool.

4. Apparatus according to claim 1, wherein the means for effecting joint movement of the cutting members comprises cam means movably mounted on the lancing tool and engageable with the cutting members, said cam means moving with respect to the cutting members.

5. Apparatus according to claim 1, wherein the mounting means securing the cutting members comprises a carrier having means therewith attached to the lancing tool and defining guides for the cutting members, the lancing tool further comprising a body having a sliding lost-motion connection with the carrier, and the means for effecting joint movement of the blades comprises cams carried by the tool body, each cam having a sliding connection with a cutting member to effect movement of the cutting members when the body moves with respect to the carrier.

6. Apparatus according to claim 5 further comprising a pair of spaced contact members supported by the carrier and engageable with the circuit pattern at opposite ends of the part of the pattern which is to be removed, and means for passing electric current between said contact members through the circuit pattern for heating said part of the pattern and thereby softening it.

7. Apparatus according to claim 1 wherein the means for advancing the first portion of the ribbon into a position beneath the inserter comprises clamp means for holding the ribbon, link means supporting the clamp means for movement toward and away from the ribbon inserter, and means for moving the link means.

8. Apparatus according to claim 1, further comprising means attached to the apparatus for segmenting a conductive circuit pattern for cutting the ribbon and for advancing another portion of the ribbon into a position between the ribbon inserter and a hole in the circuit board.

9. Apparatus according to claim 1, further comprising a turret, means for mounting the lancing tool in the turret, mounting means connected to the turret for supporting the ribbon inserter, the ribbon-advancing means and the welding electrodes from the turret in spaced relation to the lancing tool, and positioning means for sequentially moving the lancing tool, ribbon-advancing means, ribbon inserter and welding electrodes into and out of their respective functioning positions.

References Cited

UNITED STATES PATENTS

| | | | |
|---|---|---|---|
| 2,606,268 | 8/1952 | Pityo et al. | 219—103 X |
| 2,958,926 | 11/1960 | Morison | 29—155.5 |
| 3,098,951 | 7/1963 | Ayer et al. | 174—68.5 X |
| 3,202,755 | 8/1965 | Oswald | 29—626 X |

JOSEPH V. TRUHE, Primary Examiner

B. A. STEIN, Assistant Examiner

U.S. Cl. X.R.

29—624, 625, 626, 628